United States Patent
Wu et al.

(10) Patent No.: US 12,469,827 B2
(45) Date of Patent: Nov. 11, 2025

(54) ELECTRONIC DEVICE WITH LIGHT ABSORBING LAYER BETWEEN LIGHT EMITTING ELEMENTS AND MANUFACTURING METHOD THEREOF

(71) Applicant: Innolux Corporation, Miao-Li County (TW)

(72) Inventors: Chang-Ching Wu, Miao-Li County (TW); Chia-Chun Liu, Miao-Li County (TW); Yun-Sheng Chen, Miao-Li County (TW); Hao-Jung Huang, Miao-Li County (TW); Ker-Yih Kao, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 415 days.

(21) Appl. No.: 17/693,452

(22) Filed: Mar. 14, 2022

(65) Prior Publication Data
US 2022/0328459 A1  Oct. 13, 2022

Related U.S. Application Data

(60) Provisional application No. 63/172,724, filed on Apr. 9, 2021.

(30) Foreign Application Priority Data

Nov. 15, 2021 (CN) .......................... 202111350984.2

(51) Int. Cl.
H01L 25/075 (2006.01)
H10H 20/01 (2025.01)
H10H 20/852 (2025.01)

(52) U.S. Cl.
CPC ....... *H01L 25/0753* (2013.01); *H10H 20/852* (2025.01); *H10H 20/0362* (2025.01)

(58) Field of Classification Search
CPC ................. H01L 25/0753; H01L 33/52; H01L 2933/005; H01L 2933/0025; H01L 33/44; H01L 33/54; H01L 33/56
See application file for complete search history.

(56) References Cited

U.S. PATENT DOCUMENTS

2015/0311405 A1\* 10/2015 Oyamada ............... H10H 20/83
 438/27
2020/0365774 A1\* 11/2020 Zhang ..................... H01L 33/58

FOREIGN PATENT DOCUMENTS

| CN | 107507845 | 12/2017 |
| CN | 105763779 | 2/2020 |

(Continued)

OTHER PUBLICATIONS

"Office Action of Taiwan Counterpart Application", issued on Dec. 23, 2022, p. 1-p. 6.

*Primary Examiner* — Ratisha Mehta
*Assistant Examiner* — Sophia W Kao
(74) *Attorney, Agent, or Firm* — JCIPRNET

(57) ABSTRACT

An electronic device and a manufacturing method thereof are provided. The electronic device includes a substrate, multiple light emitting elements, and a light absorbing layer. The light emitting elements are disposed on the substrate. One of the light emitting elements has at least one lateral surface. The light absorbing layer is disposed on the substrate and is located between two adjacent light emitting elements, and the light absorbing layer contacts the at least one lateral surface.

12 Claims, 6 Drawing Sheets

(56) References Cited

FOREIGN PATENT DOCUMENTS

| | | | | |
|---|---|---|---|---|
| CN | 110767108 | | 2/2020 | |
| CN | 110767108 A | * | 2/2020 | |
| CN | 111653583 A | * | 9/2020 | ........... G06F 3/0443 |
| CN | 112786742 A | * | 5/2021 | ........... H01L 27/156 |
| KR | 20210057275 A | * | 11/2019 | |
| TW | 588984 | | 6/2017 | |

* cited by examiner

ELECTRONIC DEVICE WITH LIGHT ABSORBING LAYER BETWEEN LIGHT EMITTING ELEMENTS AND MANUFACTURING METHOD THEREOF

CROSS-REFERENCE TO RELATED APPLICATION

This application claims the priority benefits of U.S. provisional application Ser. No. 63/172,724, filed on Apr. 9, 2021, and China application serial no. 202111350984.2, filed on Nov. 15, 2021. The entirety of each of the above-mentioned patent applications is hereby incorporated by reference herein and made a part of this specification.

BACKGROUND

Technical Field

The disclosure relates to an electronic device and a manufacturing method thereof.

Description of Related Art

A light emitting element (such as a light emitting diode) emits light not only from its top surface but also from its lateral surface. Due to different inclination angles of multiple light emitting elements disposed on a carrier, which lead to varying degrees of light intensity of the lateral surface in a side view, problems such as color mura or white color shift are prone to occur.

SUMMARY

The disclosure provides an electronic device and a manufacturing method thereof, which may help reduce problems such as color mura or white color shift.

According to the embodiments of the disclosure, the electronic device includes a substrate, multiple light emitting elements, and a light absorbing layer. The light emitting elements are disposed on the substrate, and one of the light emitting elements has at least one lateral surface. The light absorbing layer is disposed on the substrate and is located between two adjacent light emitting elements, and the light absorbing layer contacts the at least one lateral surface.

According to the embodiments of the disclosure, the manufacturing method of the electronic device includes disposing multiple light emitting elements on a substrate, and one of the light emitting elements has at least one lateral surface. The manufacturing method of the electronic device further includes forming a light absorbing layer on the substrate, and the light absorbing layer contacts the at least one lateral surface.

Embodiments accompanied with drawings are described in detail below to make the aforementioned features and advantages of the disclosure comprehensible.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
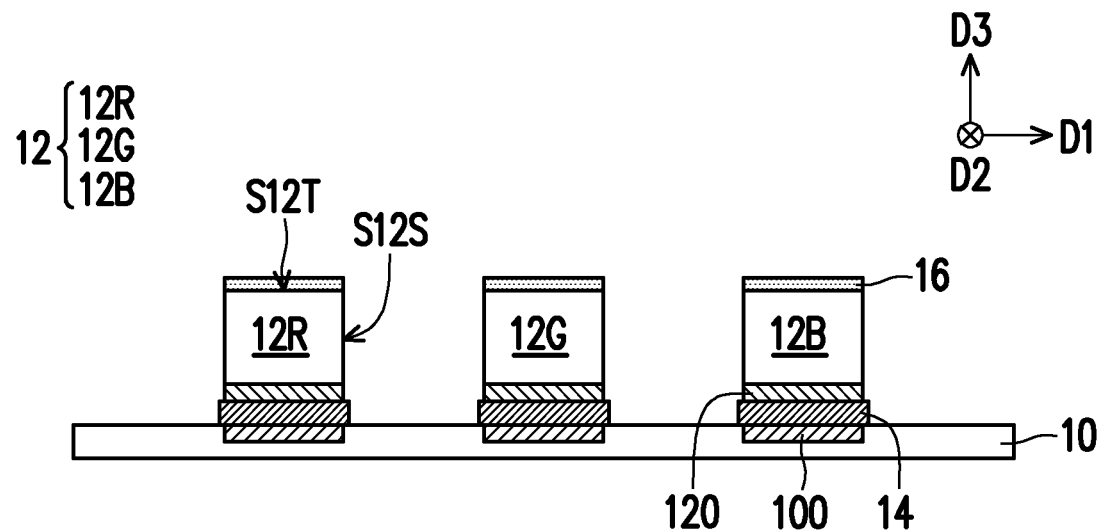
FIG. 1 to FIG. 3 are schematic partial cross-sectional diagrams of a manufacturing process of an electronic device according to some embodiments of the disclosure.

References of the exemplary embodiments of the disclosure are to be made in detail. Examples of the exemplary embodiments are illustrated in the drawings. If applicable, the same reference numerals in the drawings and the descriptions indicate the same or similar parts.

Certain words will be used to refer to specific components throughout the specification and the appended claims of the disclosure. People skilled in the art should understand that electronic device manufacturers may refer to same components under different names. The disclosure does not intend to distinguish between components having same functions but different names. In the following specification and claims, the words "having" and "including" are open-ended words and thus should be interpreted as "including but not limited to."

Wordings used herein to indicate directions, such as "up," "down," "front," "back," "left," and "right," merely refer to directions in the accompanying drawings. Therefore, the directional wordings are used to illustrate rather than limit the disclosure. In the accompanying drawings, the drawings illustrate the general features of the methods, structures, and/or materials used in the particular exemplary embodiments. However, the drawings shall not be interpreted as defining or limiting the scope or nature covered by the exemplary embodiments. For example, the relative size, thickness, and location of layers, regions, or structures may be reduced or enlarged for clarity.

The description that one structure (or layer, component, substrate) is located on another structure (or layer, component, substrate) described in this disclosure may mean that the two structures are adjacent and directly connected, or may mean that the two structures are adjacent but not directly connected. Indirect connection means that there is at least one intermediate structure (or intermediate layer, intermediate component, intermediate substrate, intermediate space) between the two structures, and the lower surface of the one structure is adjacent or directly connected to the upper surface of the intermediate structure while the upper surface of the other structure is adjacent or directly connected to the lower surface of the intermediate structure. The intermediate structure may be composed of a monolayer or multilayer physical structure or a non-physical structure and is not particularly limited. In this disclosure, when a certain structure is "on" another structure, it may mean that the certain structure is "directly" on another structure, or that the certain structure is "indirectly" on another structure; that is, there is at least one structure between the certain structure and another structure.

Ordinal numbers in this specification and the claims such as "first" and "second" are used to modify an element, and do not imply or represent that the (or these) element(s) has (or have) any ordinal number, and do not indicate any order between an element and another element, or an order in a manufacturing method. These ordinal numbers are merely used to clearly distinguish an element having a name with another element having the same name. Different terms may be used in the claims and the specification, so that a first member in the specification may be a second member in the claims.

The electrical connections or couplings described in the disclosure may all refer to direct connections or indirect connections. In the case of the direct connection, terminals of elements on two circuits are directly connected or connected through a conductive line, and in the case of the indirect connection, between the terminals of the elements on the two circuits are a switch, a diode, a capacitor, an inductor, a resistor, other suitable elements, or a combination of the above elements, but the disclosure is not limited thereto.

In the disclosure, the thickness, length, and width may be measured with an optical microscope, and the thickness or width may be measured with a cross-sectional image in an electron microscope, but the disclosure is not limited thereto. In the disclosure, any two values or directions used for comparison may have a certain error. In addition, the terms "substantially," "roughly," or "equal to" referred to herein generally mean within 10% of a given value or range Moreover, the phrases "in a given range from a first value to a second value" and "within a given range from a first value to a second value" indicate the given range includes the first value, the second value, and other values therebetween. If a first direction is perpendicular to a second direction, the angle between the first direction and the second direction may be between 80 degrees and 100 degrees; if the first direction is parallel to the second direction, the angle between the first direction and the second direction may be between 0 degrees and 10 degrees.

It should be understood that the following embodiments may replace, reorganize, and mix the features in several different embodiments to complete other embodiments without departing from the spirit of the disclosure. As long as the features of the embodiments do not violate the spirit of the disclosure or conflict each other, they may be mixed and matched as desired.

Unless otherwise defined, all terms (including technical terms and scientific terms) used herein have the same meanings commonly understood by people with ordinary knowledge in the technical field to which the present invention belongs. It will be further understood that terms such as those defined in commonly used dictionaries should be interpreted as having meanings consistent with their meaning in the context of related technologies and this disclosure, and will not be interpreted in an idealized or excessively formal way, unless explicitly defined as such in the disclosure.

In the disclosure, an electronic device may include a display device, a backlight device, or a splicing device, but the disclosure is not limited thereto. The electronic device may be a bendable electronic device or a flexible electronic device. The display device may be a non-self-luminous display device or a self-luminous display device. The splicing device may be, for example but not limited to, a display splicing device. It should be noted that the electronic device may be any combination of the foregoing, but the disclosure is not limited thereto.

It should be noted that the technical features in different embodiments provided hereinafter may be replaced, combined, or mixed with one another to constitute another embodiment without departing from the spirit of the disclosure.

Figure 2:
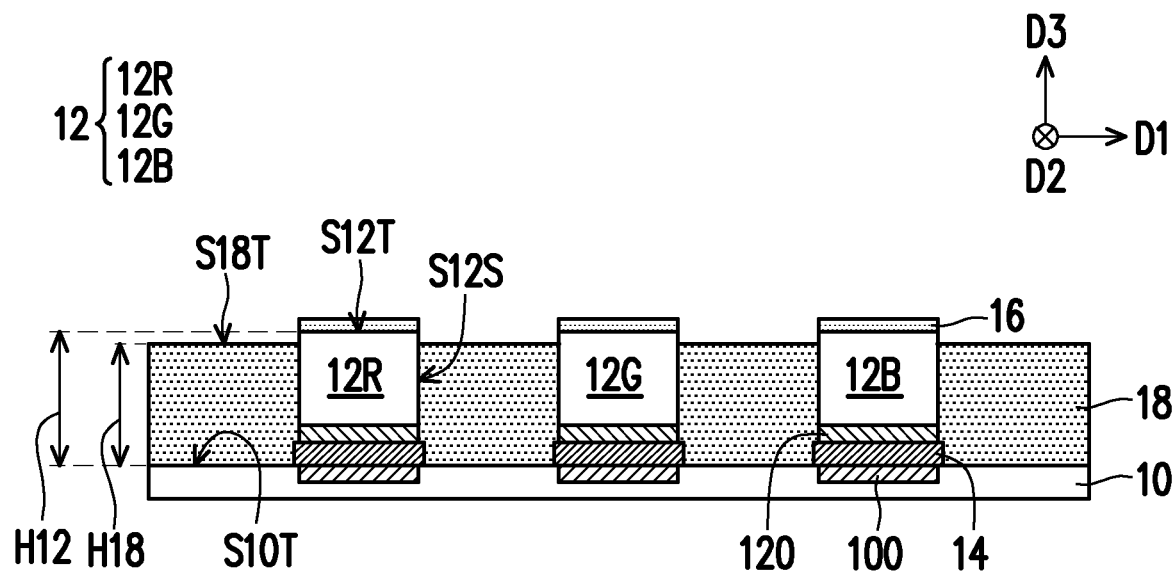
Figure 3:
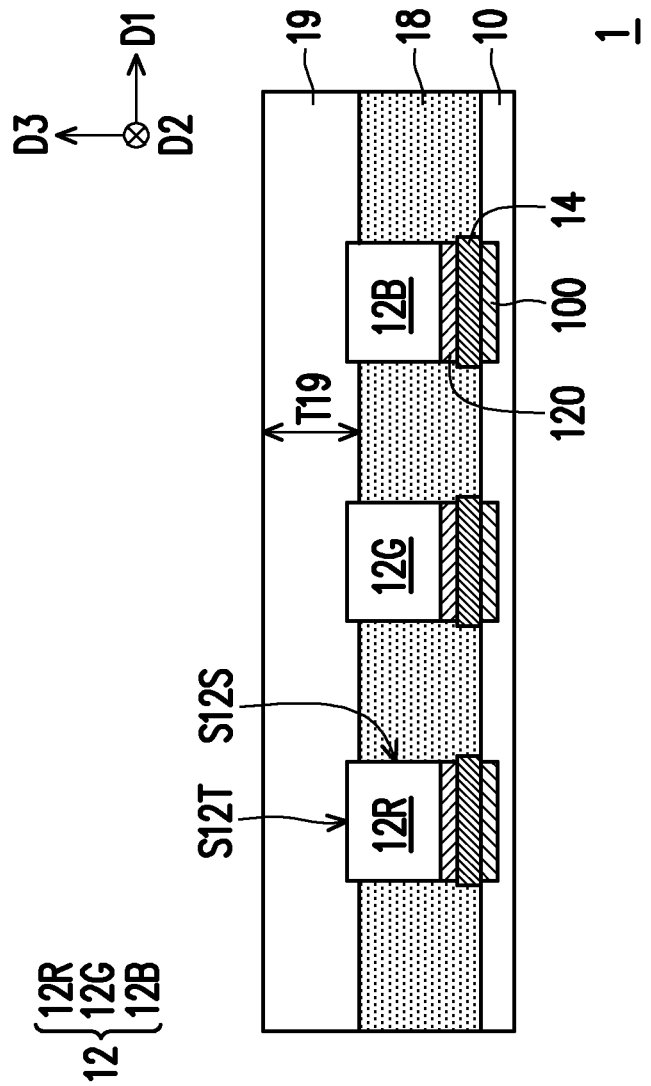

FIG. 1 to FIG. 3 are schematic partial cross-sectional diagrams of a manufacturing process of an electronic device according to some embodiments of the disclosure. With reference to FIG. 1, a manufacturing method of an electronic device may include disposing multiple light emitting elements 12 on a substrate 10. For example, the light emitting elements 12 may be disposed on the substrate 10 via surface mount technology (SMT), but the disclosure is not limited thereto.

The substrate 10 may include, for example but not limited to, a printed circuit board, a flexible printed circuit board, a glass substrate with a circuit formed thereon, or a flexible substrate with a circuit formed thereon.

The light emitting diodes 12 may include, for example but not limited to, organic light emitting diodes (OLED), sub-millimeter light emitting diodes (mini LED), micro light emitting diodes (micro LED), or quantum dot light emitting diodes (quantum dot LED).

The light emitting element 12 may include a top surface S12T and at least one lateral surface S12S. For example, the light emitting element 12 may be a cylinder, and the light emitting element 12 may include one lateral surface S12S; alternatively, the light emitting element 12 may be a polygonal cylinder (such as a quadrangular cylinder), and the light emitting element 12 may include multiple (such as four) lateral surfaces S12S.

In some embodiments, the light emitting elements 12 may be transferred from a growth substrate or a temporary carrier to the substrate 10 via a mass transfer process. For example, multiple conductive bumps 14 may be formed on multiple pads 100 of the substrate 10, and the pads 100 and the conductive bumps 14 may be correspondingly disposed. Next, the light emitting elements 12 may be respectively transferred onto the conductive bumps 14 via the mass transfer process, the light emitting elements 12 and the conductive bumps 14 may be correspondingly disposed, and a pad 120 of each light emitting element 12 may contact one corresponding conductive bump 14. In following, the pads 120 of the light emitting elements 12 may be fixed to the conductive bumps 14 via a solder reflow process. The material of the pad 100 and the pad 120 may include nickel-gold, nickel-palladium-gold, silver, gold, nickel, tin, an organic solderability preservative (OSP), other conductive materials, or a combination of the above, but the disclosure is not limited thereto. The material of conductive bump 14 may include a solder ball, a copper pillar, other suitable metal materials or metal alloy materials, but the disclosure is not limited thereto. In some embodiments, the light emitting element 12 may be, for example but not limited to, a flip chip light emitting diode and may include at least two pads (not illustrated). In other embodiments, the light emitting element 12 may be, for example but not limited to, a vertical chip light emitting diode and may include at least one pad (as shown in FIG. 1). In addition, for clarity, only one pad and one conductive bump correspondingly disposed are illustrated in the disclosure, but the number of pads of the light emitting element 12 and the number of conductive bumps disposed on the substrate are not limited in the disclosure.

In some embodiments, multiple light emitting elements 12 may include multiple red light emitting elements 12R (only one is schematically illustrated in FIG. 1), multiple green light emitting elements 12G (only one is schematically illustrated in FIG. 1) and multiple blue light emitting elements 12B (only one is schematically illustrated in FIG. 1), but the disclosure is not limited thereto. The red light emitting elements 12R, the green light emitting elements 12G, and the blue light emitting elements 12B are, for example but not limited to, alternately arranged in a direction D1 and/or a direction D2. The direction D1 and the direction D2 intersect each other and are both orthogonal to the normal direction of the substrate 10 (such as a direction D3). In some embodiments, the direction D1 and the direction D2 are orthogonal to each other, but the disclosure is not limited thereto.

In some embodiments, the manufacturing method of the electronic device may further include forming a surfactant 16 on the top surface S12T of each light emitting element 12 before forming a light absorbing layer 18 (with reference to FIG. 2). The material of the surfactant 16 may include any material not compatible with the light absorbing layer 18 to reduce the probability of the light absorbing layer 18 adhering to the top surface S12T. For example, the surfactant 16 may be formed on the top surface S12T of the light emitting element 12 by printing, such as ink-jet printing (IJP), but the disclosure is not limited thereto. In other embodiments, although not illustrated, the manufacturing method of the electronic device may also skip the step of forming the surfactant 16.

With reference to FIG. 2, the manufacturing method of the electronic device may further include forming the light absorbing layer 18 on the substrate 10, where the light absorbing layer 18 contacts the lateral surface S12S of each light emitting element 12.

For example, the light absorbing layer 18 may be formed on the substrate 10 by coating or printing. The light absorbing layer 18 may be used to absorb light (not illustrated) emitted from the lateral surface S12S of the light emitting element 12. For example, the optical density (OD) of the light absorbing layer 18 may range from 0.5 to 2, but the disclosure is not limited thereto. In some embodiments, the material of the light absorbing layer 18 may include a black adhesive, a black paint, a gray coating material, or other suitable materials, but the disclosure is not limited thereto.

In some embodiments, a height H18 of the light absorbing layer 18 may be less than or equal to a height H12 of each light emitting element 12. The height H18 of the light absorbing layer 18 is, for example, the maximum distance from the top surface S10T of the substrate 10 to the top surface S18T of the light absorbing layer 18 in the direction D3. The height H12 of the light emitting element 12 is, for example, the maximum distance from the top surface S10T of the substrate 10 to the top surface S12T of the light emitting element 12 in the direction D3. The height H18 of the light absorbing layer 18 may be changed according to different specifications (such as different degrees of shading). In some embodiments, the height H18 of the light absorbing layer 18 may be greater than or equal to half of the height H12 of the light emitting element 12 and less than or equal to the height H12 of each light emitting element 12.

With reference to FIG. 3, the manufacturing method of the electronic device may further include removing the surfactant 16. The method of removing the surfactant 16 may include heating or lighting, but the disclosure is not limited thereto. Although not illustrated, in the case where the surfactant 16 has a high light transmittance, the step of removing the surfactant 16 may be skipped.

The manufacturing method of the electronic device may further include forming a protection layer 19 on the light absorbing layer 18 and the light emitting elements 12. For example, the protection layer 19 may be formed on the light absorbing layer 18 and the light emitting elements 12 by coating. The protection layer 19 may be used to protect the light emitting elements 12. For example, the protection layer 19 may include a material with sufficient mechanical strength, good chemical resistance, high light transmittance, water/oxygen blocking abilities, or high refractive index, such as siloxane material, but the disclosure is not limited thereto. For example, the visible light transmittance of the protection layer 19 may be greater than 85% to allow most of the light emitted from the top surface S12T of the light emitting element 12 to penetrate the protection layer 19. In addition, the refractive index of the protection layer 19 may range from 1.4 to 1.9, but the disclosure is not limited thereto. In some embodiments, the "transmittance" described in the disclosure may be a percentage calculated by dividing light intensity measured after the emitted light of the light emitting element 12 has penetrated the protection layer 19 by light intensity measured when the emitted light has not penetrated the protection layer 19. The emitted light of the light emitting element 12 may include visible light (for example, with a wavelength from 380 nm to 780 nm) or ultraviolet light (for example, with a wavelength less than 365 nm), but the disclosure is not limited thereto. For example, when the emitted light of the light emitting element 12 is visible light, the light intensity is a spectral integral value within a wavelength range from 380 nm to 780 nm.

In some embodiments, the material of the protection layer 19 may include epoxy, acylic-based resin, silicone, polyimide polymer, or a combination of the above, but the disclosure is not limited thereto. In some embodiments, the protection layer 19 may be cured by heating, and the curing temperature may range from 100 degrees Celsius to 250 degrees Celsius, such as 120 degrees Celsius, 130 degrees Celsius, 200 degrees Celsius, or 250 degrees Celsius, but the disclosure is not limited thereto. In some embodiments, a thickness T19 of the protection layer 19 may range from 200 µm to 250 µm (200 µm≤thickness T19≤250 µm), but the disclosure is not limited thereto. The thickness T19 of the protection layer 19 is, for example, the maximum thickness of the protection layer 19 in the direction D3. In some embodiments, the protection layer 19 may be a bright surface or a matte surface. With the matte protection layer 19, which further helps suppress chromatic aberration or reduce graininess, optical quality of the electronic device may be improved.

After the protection layer 19 is formed, the manufacturing of an electronic device 1 is preliminarily completed. The electronic device 1 includes the substrate 10, multiple light emitting elements 12, and the light absorbing layer 18. Multiple light emitting elements 12 are disposed on the substrate 10, and the light emitting element 12 has at least one lateral surface S12S. The light absorbing layer 18 is disposed on the substrate 10 and is located between two adjacent light emitting elements 12, where the light absorbing layer 18 contacts the at least one lateral surface S12S.

In some embodiments, the electronic device 1 may further include multiple conductive bumps 14, and multiple pads 120 of the light emitting elements 12 are bonded to multiple pads 100 of the substrate 10 through the conductive bumps 14. In some embodiments, the electronic device 1 may further include the protection layer 19. The protection layer 19 is disposed on the light absorbing layer 18 and the light emitting elements 12.

In the electronic device 1, the light absorbing layer 18 covering the lateral surface S12S of the light emitting element 12 may absorb the light emitted from the lateral surface S12S of the light emitting element 12, thereby facilitating handling problems such as color mura or white color shift caused by different degrees of light intensity in a side view.

Figure 4A:
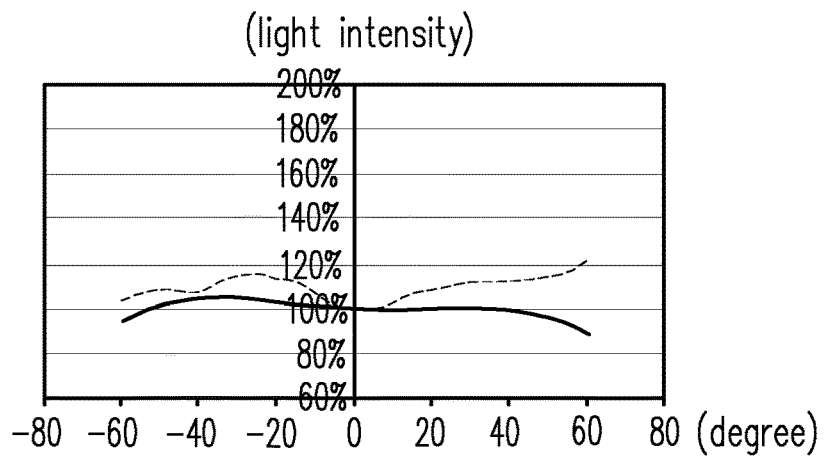
FIG. 4A to FIG. 4C are respective relationship diagrams between zenith angles and light intensity regarding a red light emitting element, a green light emitting element, and a blue light emitting element at an azimuth angle of 0 degrees.
Figure 4B:
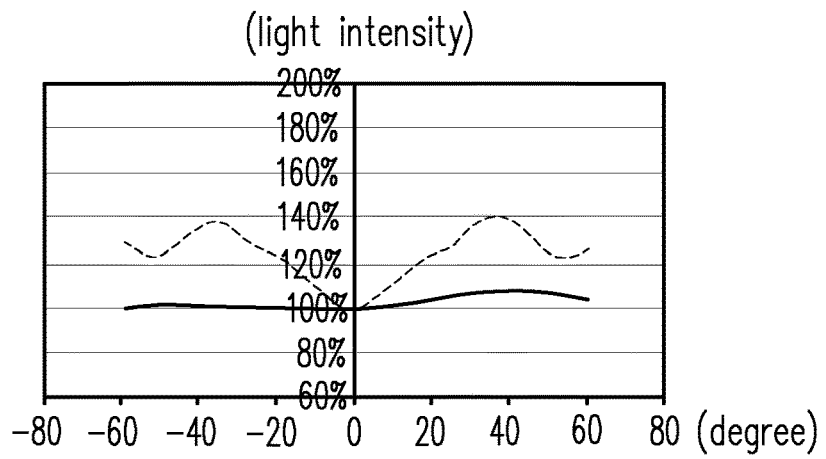
Figure 4C:
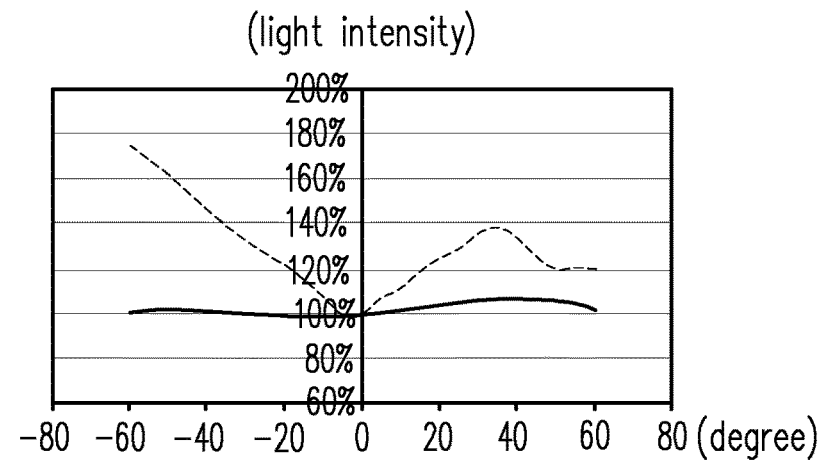
Figure 5A:
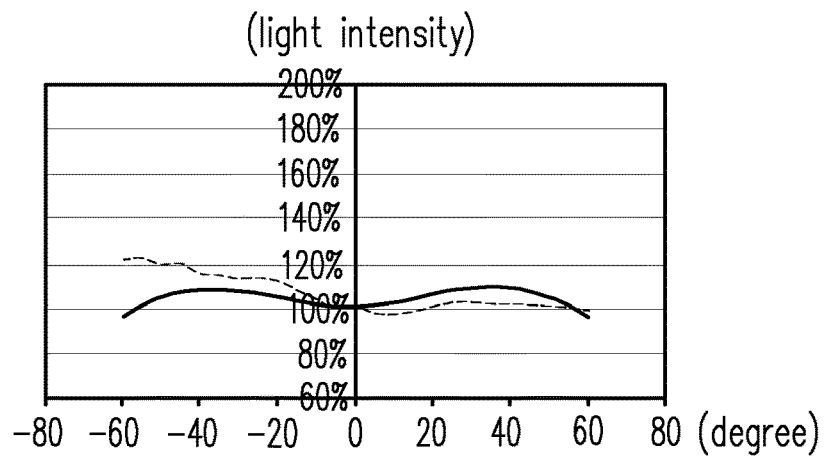
FIG. 5A to FIG. 5C are respective relationship diagrams between zenith angles and light intensity regarding the red light emitting element, the green light emitting element, and the blue light emitting element at an azimuth angle of 90 degrees.
Figure 5B:
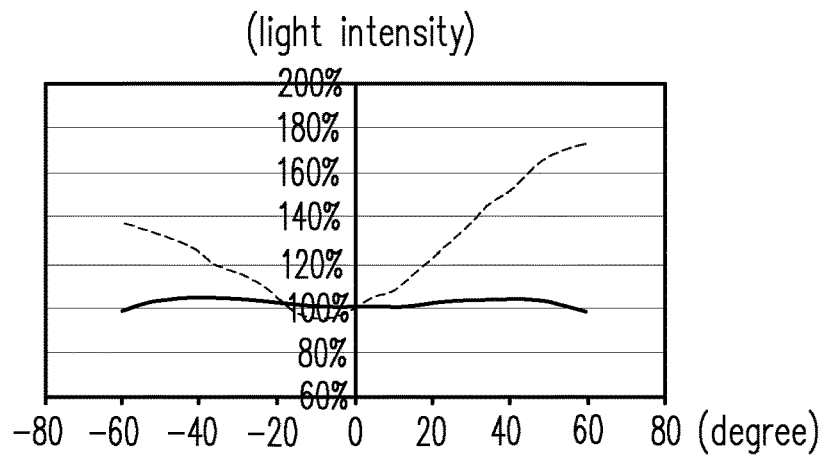
Figure 5C:
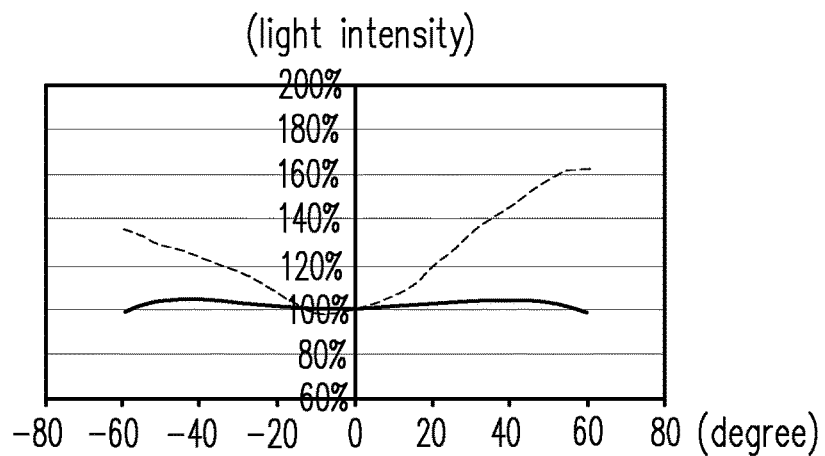

FIG. 4A to FIG. 4C are respective relationship diagrams between zenith angles and light intensity regarding a red light emitting element, a green light emitting element, and a blue light emitting element at an azimuth angle of 0 degrees. FIG. 5A to FIG. 5C are respective relationship diagrams between zenith angles and light intensity regarding the red light emitting element, the green light emitting element, and the blue light emitting element at an azimuth angle of 90 degrees. It should be noted that the disclosure uses a light intensity of 100% at a zenith angle of 0 degrees as a benchmark for comparison.

In FIG. 4A to FIG. 5C, dashed lines and solid lines respectively represent conditions where a light absorbing layer is not disposed and conditions where a light absorbing layer is disposed. According to FIG. 4A to FIG. 5C, with the light absorbing layer disposed, difference in light intensity at different viewing angles may be reduced, thereby facilitating solving problems such as color mura or white color shift.

An optical microscope, a 3D microscope, or a scanning electron microscope (SEM) may be used to observe whether there is a light absorbing layer on a lateral surface of a light emitting element in a product. In the case where a light absorbing layer is disposed, it is difficult to observe the lateral surface of the light emitting element through an optical microscope or a 3D microscope. Therefore, a cross section polisher (CP) technology may be used to polish the lateral surface or the cross section of the light emitting element before using the scanning electron microscope to observe the lateral surface or the cross-section of the light emitting element. In the case where a light absorbing layer is not disposed, the lateral surface of the light emitting element may be easily observed through the optical microscope, the 3D microscope, or the scanning electron microscope. Before observation, the protection layer may selectively be removed (for example, by tearing) to observe a clearer image.

Figure 6:
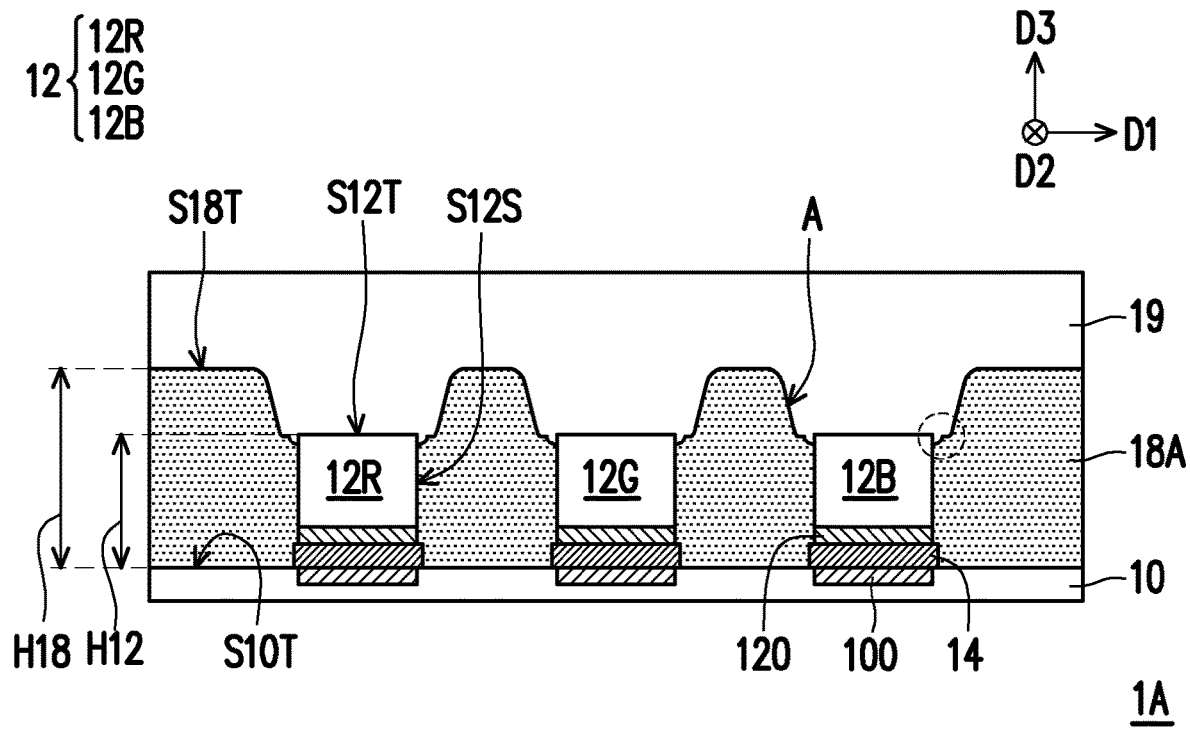
FIG. 6 to FIG. 8 are respective schematic partial cross-sectional diagrams of an electronic device according to some embodiments of the disclosure.
Figure 7:
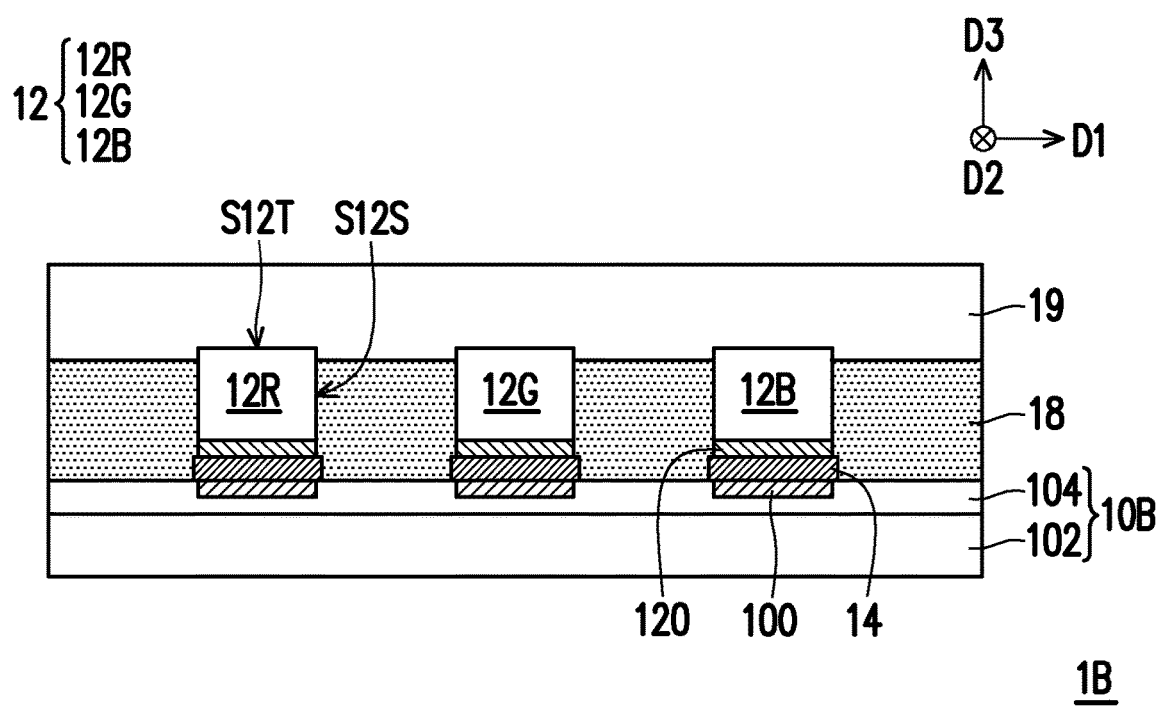
Figure 8:
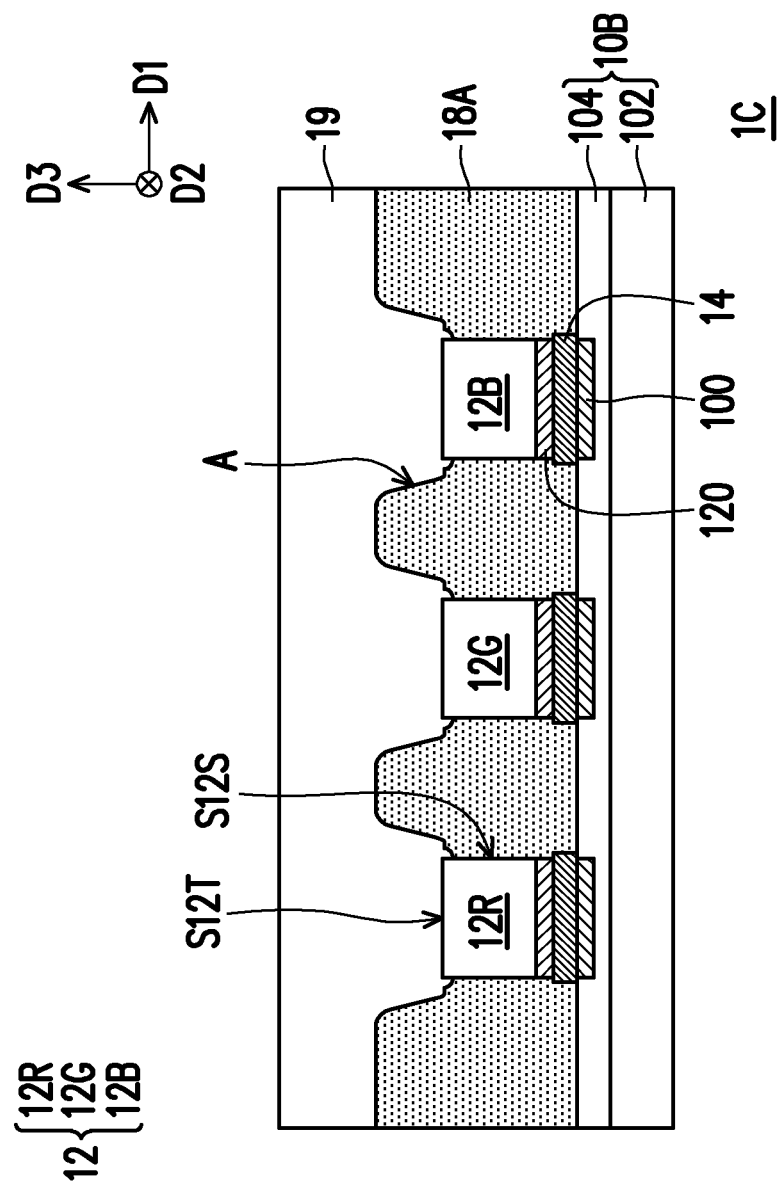

FIG. 6 to FIG. 8 are respective schematic partial cross-sectional diagrams of an electronic device according to some embodiments of the disclosure. With reference to FIG. 6, the main difference between an electronic device 1A and the electronic device 1 in FIG. 3 is explained as follows.

In the electronic device 1A, the height H18 of a light absorbing layer 18A is greater than the height H12 of each light emitting element 12, and the light absorbing layer 18A exposes the top surface S12T of each light emitting element 12.

The manufacturing method of the electronic device 1A includes, for example, disposing multiple light emitting elements 12 on the substrate 10 and then forming a light absorbing layer 18A on the substrate 10. For example, the light absorbing material may be disposed on the substrate 10 by coating or printing and cover the light emitting elements 12, and multiple openings A exposing the top surfaces S12T of the light emitting elements 12 may be formed via a patterning process (such as a yellow light process or a laser method). Next, a protective material is formed on the light absorbing layer 18A and in the openings A, and the protective material is cured by heating via a heating process to form the protection layer 19.

In some embodiments, depending on different protection materials as selected or different etching selection ratios of etchants in the patterning process, the protection layer 19 may have an undercut near the light emitting element 12 (as circled with dashed lines in FIG. 6), which means the boundary between the protection layer 19 and the light absorbing layer 18A near the light emitting element 12 may be uneven. However, in other embodiments, although not illustrated, the top surface S12T of the light emitting element 12 may also be exposed via other processes (such as a polishing process). In the case of adopting the polishing process, the height H18 of the light absorbing layer 18A may be substantially equal to the height H12 of each light emitting element 12.

With reference to FIG. 7, the main difference between an electronic device 1B and the electronic device 1 in FIG. 3 is explained as follows. In the electronic device 1B, a substrate 10B is, for example, an element array substrate. For example, the substrate 10B may include a carrier 102 and an element array layer 104 disposed between the carrier 102 and multiple light emitting elements 12, and multiple pads 100 are located in the element array layer 104. The carrier 102 may include a glass carrier or a plastic carrier, but the disclosure is not limited thereto. Although not illustrated, the element array layer 104 may include multiple elements (such as multiple active elements) and multiple lines (such as multiple signaling lines or multiple power lines). However, the disclosure is not limited thereto. In some embodiments, the electronic device 1B may serve as a display device, while the electronic device 1 in FIG. 3 may serve as a backlight module, but the disclosure is not limited thereto.

With reference to FIG. 8, the main difference between an electronic device 1C and the electronic device 1A in FIG. 6 is explained as follows. The electronic device 1C also uses the substrate 10B shown in FIG. 7 to carry multiple light emitting elements 12. Therefore, the electronic device 1C may also serve as a display device, but the disclosure is not limited thereto.

In summary, in the embodiments of the disclosure, the light absorbing layer covering the lateral surface of the light emitting element absorbs the light emitted from the lateral surface of the light emitting element. Therefore, the electronic device helps handle problems such as color mura or white color shift caused by different degrees of light intensity in a side view.

The above embodiments are only used to illustrate technical solutions of the disclosure and are not intended to limit the disclosure. Although the disclosure has been described in detail with reference to the above embodiments, people of ordinary skill in the art should understand that they may still modify the technical solutions described in the above embodiments, or replace some or all of the technical features therein with equivalents, and such modifications or replacements of corresponding technical solutions do not substantially deviate from the scope of the technical solutions of the embodiments of the disclosure.

Although the disclosure has been disclosed in the above embodiments, the embodiments are not intended to limit the disclosure. People skilled in the art may make some changes, replacements, and modifications without departing from the spirit and the scope of the disclosure, and the features between the embodiments may be arbitrarily mixed and matched to form other new embodiments. Moreover, the scope of the disclosure is limited to the processes, machines, manufacture, compositions of matter, means, methods, or steps of the particular embodiments described in the specification. People of ordinary skill in the art may understand the processes, machines, manufacture, compositions of matter, means, methods, or steps, presently existing or later to be developed from the disclosure. Those performing substantially the same function or achieving substantially the same result as the corresponding embodiments described herein may be utilized according to the disclosure. Therefore, the appended claims of the disclosure include the above processes, machines, manufacture, compositions of matter, means, methods, or steps. In addition, each claim constitutes a separate embodiment, and the scope of the disclosure also includes a combination of each claim and embodiment. The scope of the disclosure is subject to the definition of the scope of the appended claims.

What is claimed is:

1. An electronic device, comprising:
   a substrate;
   a plurality of light emitting elements, disposed on the substrate, wherein one of the plurality of light emitting elements has at least one lateral surface;
   a light absorbing layer, disposed on the substrate and located between two of the plurality of light emitting elements that are adjacent to each other, wherein the light absorbing layer contacts the at least one lateral surface,
   a protection layer, disposed on the light absorbing layer and the plurality of light emitting elements, and has a matte surface, wherein a height of the light absorbing layer is greater than a height of the plurality of light emitting elements, and the light absorbing layer exposes a top surface of the plurality of light emitting elements,
   wherein the light absorbing layer comprises a plurality of openings, and the plurality of openings have a U shape respectively, and
   wherein the protection layer covers the light absorbing layer, and a portion of the protection layer fills the plurality of openings.

2. The electronic device according to claim 1, wherein a visible light transmittance of the protection layer is greater than 85%.

3. The electronic device according to claim 1, wherein a refractive index of the protective layer ranges from 1.4 to 1.9.

4. The electronic device according to claim 1, wherein an optical density of the light absorbing layer ranges from 0.5 to 2.

5. A manufacturing method of an electronic device, comprising:
   disposing a plurality of light emitting elements on a substrate, wherein one of the plurality of light emitting elements has at least one lateral surface;
   forming a light absorbing layer on the substrate, wherein the light absorbing layer contacts the at least one lateral surface; and
   disposing a protection layer having a matte surface on the light absorbing layer and the plurality of light emitting elements, wherein forming the light absorbing layer on the substrate comprises:
   disposing a light absorbing material on the substrate to cover the plurality of light emitting elements; and
   performing a patterning process on the light absorbing material to form a plurality of openings respectively exposing top surfaces of the plurality of light emitting elements,
   wherein the plurality of openings are respectively U-shaped.

6. The manufacturing method of the electronic device according to claim 5, further comprising:
   forming a surfactant on each of the top surfaces of the plurality of light emitting elements before forming the light absorbing layer.

7. The manufacturing method of the electronic device according to claim 6, further comprising:
   removing the surfactant after forming the light absorbing layer.

8. The manufacturing method of the electronic device according to claim 5, wherein the patterning process comprises a yellow light process or laser drilling.

9. The manufacturing method of the electronic device according to claim 5, wherein forming the light absorbing layer on the substrate comprises:
   performing a polishing process on the light absorbing material to expose a top surface of each of the top surfaces of the plurality of light emitting elements.

10. The manufacturing method of the electronic device according to claim 5, wherein a visible light transmittance of the protection layer is greater than 85%.

11. The manufacturing method of the electronic device according to claim 5, wherein a refractive index of the protective layer ranges from 1.4 to 1.9.

12. The manufacturing method of the electronic device according to claim 5, wherein an optical density of the light absorbing layer ranges from 0.5 to 2.

* * * * *